United States Patent [19]

Sandy et al.

[11] 4,130,813

[45] Dec. 19, 1978

[54] SURFACE WAVE DEVICE HAVING ENHANCED REFLECTIVITY GRATINGS

[75] Inventors: Frank Sandy, Lexington; Clarence J. Dunnrowicz, Waltham, both of Mass.

[73] Assignee: Raytheon Company, Lexington, Mass.

[21] Appl. No.: 799,622

[22] Filed: May 23, 1977

[51] Int. Cl.² .................. H03H 9/02; H03H 9/26; H01L 41/22; H01L 41/10

[52] U.S. Cl. ................................ 333/72; 29/25.35; 310/313

[58] Field of Search .............. 333/72, 30; 29/25.35, 29/594; 310/313; 331/107 A

[56] References Cited

U.S. PATENT DOCUMENTS

| | | | |
|---|---|---|---|
| 3,983,517 | 9/1976 | Weglein | 333/72 |
| 4,013,983 | 3/1977 | Hartemann | 333/72 |
| 4,065,735 | 12/1977 | Palfreeman et al. | 333/72 |

OTHER PUBLICATIONS

Sandy et al. — "Research and Development Technical Report — Report Ecom-75-1348-1," Raytheon Research Division, Watham, Ma., Mar. 1976; title pages; pp. i, ii, iii, and 1-47.

Primary Examiner—Alfred E. Smith
Assistant Examiner—Marvin Nussbaum
Attorney, Agent, or Firm—M. D. Bartlett; J. D. Pannone; H. W. Arnold

[57] ABSTRACT

Surface acoustic wave devices are disclosed which have enhanced reflectivity gratings with conductive stripes between grooves in the substrate or conductive stripes within the grooves. For lithium niobate substrates, aluminum stripes coupled together and positioned between grooves or unconnected and positioned within the grooves are preferred. For quartz substrates, gold stripes within the grooves are used. Methods for fabricating such structures are also disclosed.

22 Claims, 22 Drawing Figures

SURFACE WAVE DEVICE HAVING ENHANCED REFLECTIVITY GRATINGS

The invention herein described was made in the course of or under a contract or subcontract thereunder, with the Department of the Army,

BACKGROUND OF THE INVENTION

1. Field of the Invention

The invention pertains to surface wave devices and reflecting mechanisms used with such devices.

2. Description of the Prior Art

In the construction of surface acoustic wave devices it is often desired to provide a reflecting mechanism for directing surface waves between input and output transducers or along a predetermined path so that various operations may be performed upon the propagating surface waves. Probably the most common reflecting mechanism thus far used is the reflecting grating. This has heretobefore consisted of either a number of parallel grooves cut into the surface of the substrate upon which the surface waves propagate, or else a number of parallel conductive stripes positioned upon the surface of the substrate. The reflecting grooves or stripes are ordinarily positioned so that reflections from adjacent ones of the grooves or stripes will be additive in phase so that the grating will be maximumly reflective. Unfortunately, only a very small percentage of the energy contained in an incoming surface wave would be reflected by any one groove or stripe within the grating. Total overall reflectivity of the grating could be improved by adding more and more reflecting elements. However, the bandwidth of the reflecting grating generally decreased in inverse proportion to the number of reflecting elements provided. Thus, with a high reflectivity grating, only very small bandwidths were typically available. In many devices such as filters, it has been desirable to to provide both high reflectivity and broad bandwidth. With the reflecting grating of the prior art it was frequently not possible to construct a surface wave filter device having both desired properties. Using a smaller number of reflective elements within each grating to obtain a required bandwidth often made the insertion loss of the device higher than desired because of the loss of signal at the reflecting gratings.

With reflecting gratings comprised of metal stripes, the reflectivity per element due to piezoelectric shorting is fixed, depending upon the type of piezoelectric material used for the substrate. Gratings constructed using metal stripes provided periodic mass loading as well as a topographical perturbation and hence die have a reflection coefficient which could be increased by increasing the thickness of the metal. However, nonlinear effects upon the waves and conversion of surface wave energy to bulk wave energy became evident as the thickness was increased beyond certain limits.

SUMMARY OF THE INVENTION

Accordingly, it is an object of the present invention to provide a surface wave device including one or more reflecting gratings and having both a wide bandwidth and low insertion loss.

It is also an object of the present invention to provide such a device having minimal nonlinear effects upon the surface waves and with minimal conversion of surface wave energy to bulk wave energy.

These, as well as other objects of the invention, may be met by providing the combination of means for supporting surface wave propagation and first and second reflecting means upon the surface wave propagation supporting means with the first and second reflecting means being at least partially interspersed with one another. That is, the first and second reflecting means may, within a single reflecting structure, alternate with one another or be co-located with one another within or upon the supporting means. The surface wave supporting means may be a piezoelectric substrate having one or more smooth surfaces upon which surface waves may propagate or, alternatively, a non-piezoelectric substrate having a piezoelectric overlay. The first and second reflecting means are chosen and positioned such that the surface waves reflected by the first reflecting means are in phase with those reflected by the second reflecting means. The first reflecting means may comprise a conductive material such as a metal or a portion of the reflecting means rendered conductive such as by the introduction of conductive material within the atomic structure of the supporting means while the second reflecting means comprises grooves within the surface wave supporting means. In one preferred embodiment, the first reflecting means is positioned at least partially within the second reflecting means. In another preferred embodiment, at least portions of the second reflecting means are positioned between ones of the second reflecting means. In the latter case, the center line second reflecting means may lie within a different plane than that of the first reflecting means.

The invention may also be practiced by providing the combination of a substrate for supporting surface wave propagation and one or more reflecting means for reflecting surface waves upon the substrate where each of the reflecting means has a plurality of substantially parallel grooves within the substrate and a plurality of metal stripes positioned on the surface of the substrate between the grooves. At least some of the metal stripes may be connected electrically in parallel. In a preferred embodiment, the metal stripes are constructed of aluminum while the substrate is constructed of lithium niobate. The width of the grooves and of the metal stripes is preferably substantially one-half wavelength of the surface waves to be reflected. There may further be provided one or more transducers coupled to the same substrate for launching and receiving surface waves.

Objects of the invention may also be met by providing the combination of a substrate for supporting surface wave propagation and one or more means for reflecting surface waves upon the substrate where the reflecting means includes a plurality of substantially parallel grooves with metal stripes positioned within at least some of the grooves. Again, the width of the grooves and of the metal stripes is preferably one-half of the wavelength of the surface waves to be reflected. The substrate may be lithium niobate while the metal stripes are aluminum with no interconnection therebetween. In preferred embodiments, the height of the metal stripes is less than the depth of the grooves. In another embodiment, the substrate may be quartz while the metal stripes are gold. A layer of chromium may be placed between the quartz substrate and the gold conductive metal stripes to improve the adhesion of the gold to the quartz substrate.

Further, the invention may be practiced by a surface wave filter device which comprises the combination of a substrate for supporting surface wave propagation, an input transducer coupled to the substrate for launching surface waves on the substrate in two opposed directions, an output transducer for receiving at least a portion of the surface waves launched for the input transducer, and at least four frequency selective surface wave reflecting means or gratings for directing at least portions of the surface waves launched by the input transducer from each of the two opposed directions toward the output transducer wherein each of the reflecting means includes a plurality of substantially parallel grooves within the substrate and with a plurality of metal stripes interspersed with the grooves. The substrate may be lithium niobate while the metal of the metal stripes is aluminum. The metal stripes may be positioned between the grooves and coupled in parallel. Otherwise, the metal stripes may be positioned within the grooves and left unconnected. In a preferred embodiment, the reflecting means are four in number and positioned to form a substantially rectangular propagation path for surface waves propagating between the input and output transducers. In another embodiment, the substrate comprises quartz while the metal of the metal stripe comprises gold with metal stripes positioned within the grooves. Again, a layer of chromium is positioned between the gold and the quartz to improve the adhesion between the substrate and gold conductive layer. The height of the gold is preferably less than the depth of the grooves.

Devices in accordance with the invention may be constructed by the method comprising the steps of providing a substrate of material having at least one surface adapted for propagation of surface waves thereupon, covering at least a portion of the surface with a layer of metal, removing portions of the layer of metal in the form of a plurality of parallel stripes, and removing portions of the substrate lying beneath the removed portions of the layer of metal to a predetermined depth. Unwanted portions of the remaining layer of metal may also be removed. In a preferred embodiment the material of the substrate is lithium niobate while aluminum is used for the metal layer. Also in the preferred embodiment, the remaining portions of metal layer after unwanted portions are removed are in the form of parallel interconnected stripes. The step of removing portions of the substrate may comprise ion etching.

Devices in accordance with the present invention may also be constructed by a method comprising the steps of providing a substrate of material having at least one surface adapted for propagation of surface waves thereupon, covering at least portions of the substrate with a first layer of metal, removing portions of the first layer of metal in the form of a plurality of parallel stripes, removing portions of the substrate lying beneath the removed portions of the first layer of metal to a predetermined depth to form a plurality of substantially parallel grooves within the substrate, depositing a second layer of metal which lies at least partially within the grooves, and removing portions of the first layer of metal. Portions of the second layer of metal lying outside of the grooves may also be removed. The substrate may be lithium niobate while the second layer of metal is aluminum. The second layer of metal may be deposited using an evaporation technique. In other embodiments, the substrate may be quartz while the second metal layer may be gold. A layer of chromium may also be used between the substrate and gold layer.

DESCRIPTION OF THE PREFERRED EMBODIMENT

Figure 1:
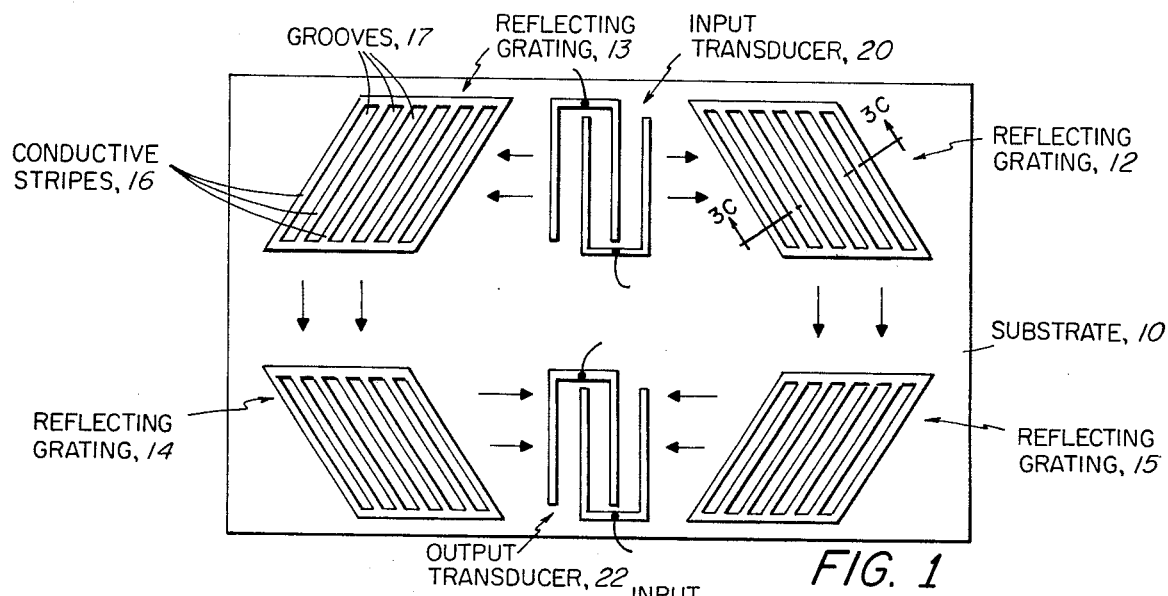
FIG. 1 is a top planar view of a first embodiment of the invention as a filter device.

Referring first to FIG. 1 there is shown a top planar view of a surface wave filter device in which the present invention is used to advantage. Upon exitation from an external electrical signal source, input transducer 20 launches input surface waves in two opposed directions toward reflecting gratings 12 and 13 as indicated by arrows. The surface wave signals received by reflecting gratings 12 and 13 are in turn reflected away at 90° angles toward reflecting gratings 15 and 14, respectively. Finally, the surface wave signals are again reflected at 90° angles by reflecting gratings 15 and 14 toward output transducer 22 where they are received, converted back to an electrical signal and coupled outward to an external signal utilization circuit.

Because of the frequency-selective properties of reflecting gratings 12-15, input transducer 20 and output transducer 22 predominantly only those surface waves having a frequency within the passband of the device will be coupled between input transducer 20 and output transducer 22. Most of the energy in surface waves having frequencies falling outside of the passband, will not be reflected by any of the reflecting gratings 12-15 and will be converted to bulk waves or otherwise diverted from reaching output transducer 22. It is to be noted that with the configuration shown in FIG. 1, substantially all of the surface wave energy within the passband of the device launched by input transducer 20 will eventually reach output transducer 22 if the reflecting gratings are sufficiently highly reflective because waves from both directions as launched by input transducer 20 are reflected toward output transducer 22. In prior art devices substantially one-half of the energy in the surface waves launched by an input transducer was lost as surface waves from only one direction ultimately reached the output transducer. Input transducer 20 and output transducer 22 are shown here as interleaved fingers with only two fingers per half connection. Ordinarily many more fingers than this would be used for each connection, only two being shown for each here for clarity of illustration.

In many applications of such filter devices it is desired to provide a relatively wide bandpass as well as a low insertion loss. Previously, when enough reflective elements within each reflecting grating were provided to produce the minimumly acceptable insertion loss, the bandwidth was found to be too small hence making it unacceptable to use such a surface wave filter device for a particular application. However, in accordance with the teachings of the present invention, the reflection per grating is substantially increased over that of previous reflecting gratings of the same dimensions and number of reflective elements.

In accordance with the invention as applied to the embodiment of FIG. 1, each reflecting grating 12-15 is constructed by providing plural electrically parallel coupled conductive stripes 16 with grooves between each stripe. Preferably, the width of the stripes and of the grooves is substantially one-half wavelength of the surface waves to be reflected. Both conductive stripes 16 and grooves 17 produce reflection. Because of the arrangement specified between conductive stripes 16 and grooves 17, the surface waves reflected from conductive stripes 16 are in phase with those reflected by grooves 17.

In the preferred embodiment, the substrate is constructed of piezoelectric material, lithium niobate, while conductive stripes 16 are aluminum. Conductive stripes 16 then provide a shorting of the piezoelectric effect producing reflections substantially 180° out of phase from those produced by grooves 17 by the topographical reflection mechanism. For aluminum, the conductive stripes 16 may be relatively thick as to enhance the topographical reflection of the adjacent grooves 17.

Figure 3A:
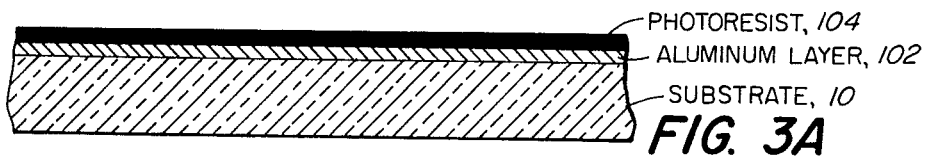
FIGS. 3A-3C are a series of cross-sectional views illustrating steps of construction of the device shown in FIG. 1.
Figure 3B:
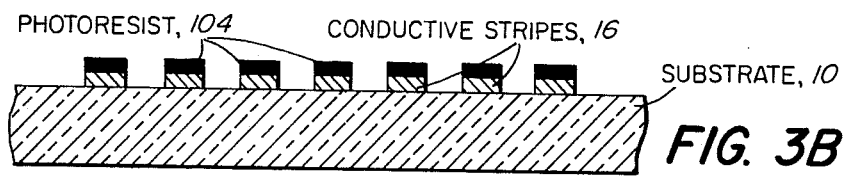
Figure 3C:
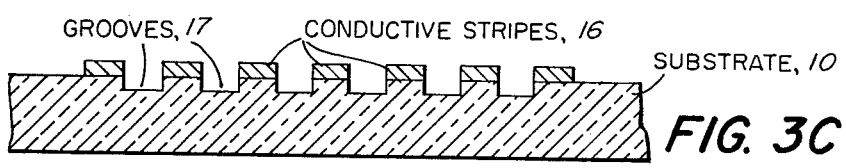

Referring next to the cross-sectional views of 3A-3B, a method of constructing reflecting gratings 12-15 as in FIG. 1 will be described. A substrate 10 having at least an outer surface which is smooth and suitable for surface wave propagation is first provided. Upon the surface of substrate 10 is then deposited aluminum layer 102. Deposition of aluminum layer 102 may be accomplished by evaporation, sputtering or any other well-known aluminum deposition procedure. Aluminum layer 102 is then covered with a layer of photoresist 104. Photoresist layer 104 is then masked, exposed to developing radiation and chemically removed in the pattern shown in FIG. 3B. The exposed portion of aluminum layer 102 is removed through the openings in photoresist layer 104 such as by sputter etching leaving conductive stripe 16 as shown in FIG. 3B. Next, as illustrated in FIG. 3C, grooves 17 are cut into substrate 10 between each conductive stripe 16 to a preferred depth. The removal of the substrate material may be accomplished by ion etching.

Figure 2:
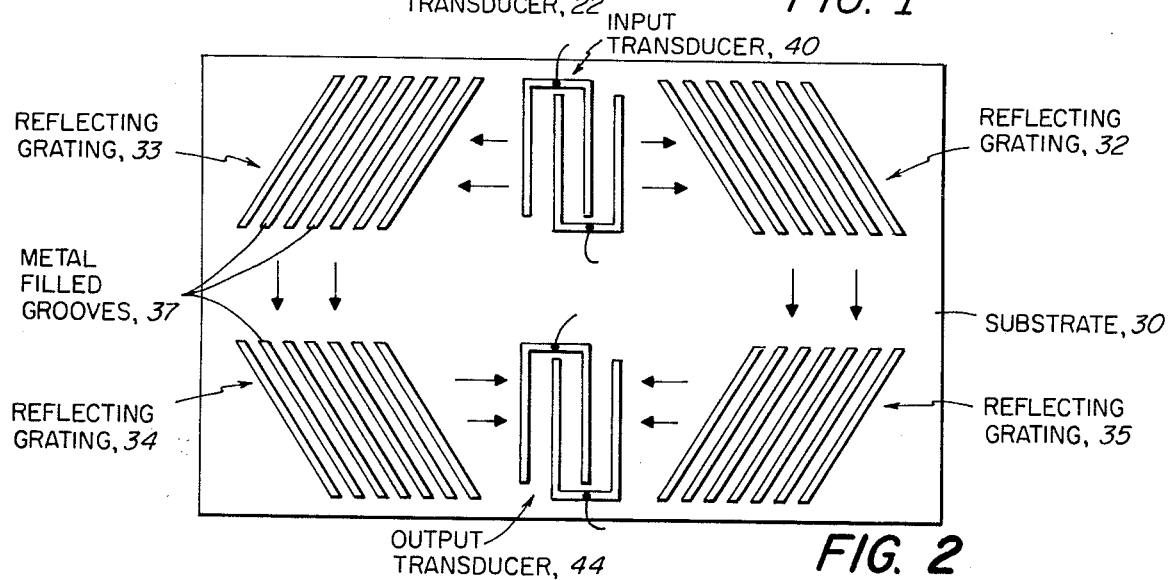
FIG. 2 is a top planar view of a second embodiment of the invention as a filter device.

Referring now to the top planar view of FIG. 2, there is shown another surface wave filter device with enhanced reflecting gratings according to another aspect of the invention. The device shown in FIG. 2 functions in substantially the same manner as that of FIG. 1 providing a low insertion loss and relatively wide passband but with a different construction of reflecting gratings. Here, reflecting gratings 32-35 are each constructed as a number of parallel grooves within substrate 30, at least some of the grooves being at least partially filled with a conductive material such as metal. The metal stripes are left unconnected from each other in this embodiment. As in the embodiment shown in FIG. 1, a substrate of lithium niobate and conductive stripes of aluminum may be employed. Also, as in the device shown in FIG. 1, the grooves provide a topographical reflection of incoming surface waves. The metal stripes provide reflections from two mechanisms, shorting of the piezoelectric effect and electrical regeneration of the surface waves. The waves reflected by these two mechanisms are 180° out of phase with one another. However, the reflection coefficient for waves due to regeneration is stronger than that for the waves reflected due to piezoelectric shorting. The surface waves produced by regeneration are in phase with those produced by the topographical effect of the grooves so that there is an addition of amplitude and hence increased reflectivity from the presence of the metal within the grooves. It is preferred that the conductive stripes be thin so that only a minimal reduction of the topographical reflection of the grooves is produced.

According to still another aspect of the invention, it has been found to be particularly advantageous to use gold stripes within grooves upon a quartz substrate. A thin layer of chromium may be used between the quartz and gold stripes to improve the adhesion of the gold to the quartz substrate. In the case of gold stripes and a quartz substrate, the gold stripes produce reflections from both mass loading and topographical effects. The piezoelectric shorting due to the presence of the gold stripes is substantially negligible. The surface waves reflected due to the mass loading effect are 180° out of phase with those produced by the topographical effect. However, if the gold stripes are recessed in the grooves filling less than the entire groove, the topographical effect may be minimized. Surface waves reflected by the mass loading effect are in phase with those produced by the topographical effect of the grooves so that the net reflection coefficient of the grating is enhanced due to the presence of the recessed gold stripes.

Referring to the sequence of cross-sectional views of FIG. 4A-4G there are shown steps of a first method used for constructing the reflecting gratings of the device shown in FIG. 2. The method illustrated in conjuction with FIGS. 4A-4G is particularly applicable for acid-soluble substrates.

Figure 4A:
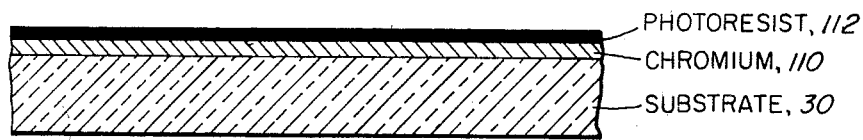
FIGS. 4A-4G are a series of cross-sectional views illustrating a first method for constructing a device as shown in FIG. 2.
Figure 4B:
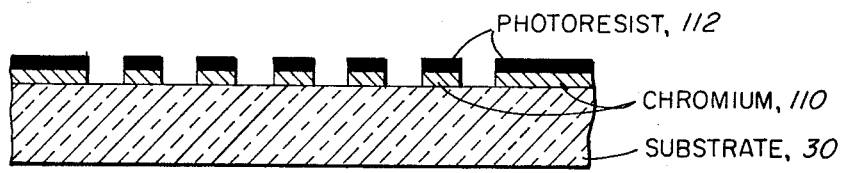
Figure 4C:
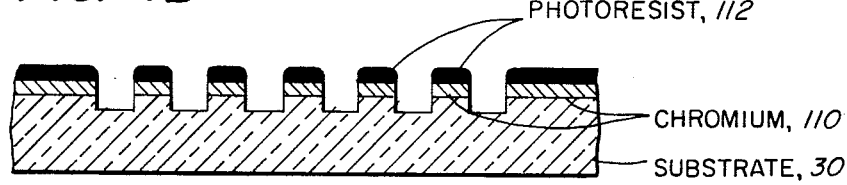
Figure 4D:
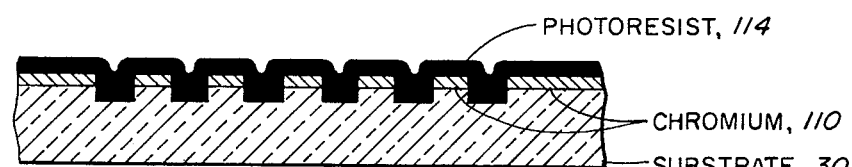
Figure 4E:
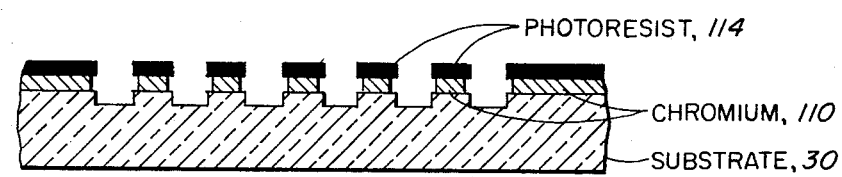
Figure 4F:
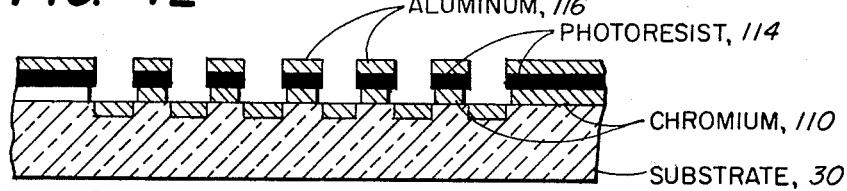
Figure 4G:
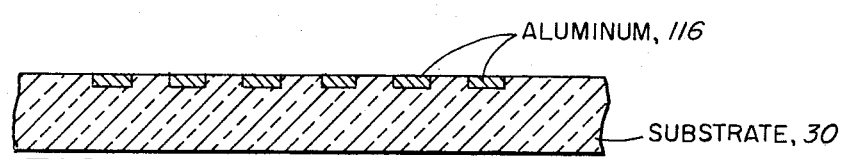

As shown in FIG. 4A, a substrate 30 having an upper surface which is substantially smooth and suitable for propogation of surface waves is provided. Upon substrate 30 there is deposited a layer of chromium 110 by any of a number of well-known deposition techniques. Atop chromium layer 110 is deposited photoresist layer 112. Referring next to FIG. 4B, photoresist layer 112 is masked, exposed and chemically removed in the pattern shown. Chromium layer 110 is etched away under the removed portions of photoresist layer 112 down to the surface of substrate 30. Grooves are then etched into substrate 30 through the openings in photoresist layer 112 and chromium layer 110 preferably by ion etching. Photoresist layer 112 is then chemically removed and a new continuous photoresist layer 114 deposited over the exposed surface of remaining portions of chromium layer 110 and into the grooves of substrate 30 as shown in the view of FIG. 4D. Next, as shown in FIG. 4E, light is shown through substrate 30 from the lower side thereof to expose the portions of photoresist layer 114 lying within the grooves in substrate 30. The exposed portion of photoresist layer 114 is then chemically removed. Following this step, as shown in FIG. 4E, chromium layer 110 is slightly undercut using an appropriate etch. Next, as illustrated in FIG. 4F, aluminum 116 is deposited using an evaporation technique into the grooves as well as upon the exposed upper surface of photoresist layer 114. Deposition is stopped when aluminum layer 116 is even with the surface of substrate 30. Finally, to complete fabrication of the reflecting grating, the remaining portions of photoresist layer 114, chromium layer 110, and the portion of the aluminum layer 116 atop photoresist layer 114 are chemically removed leaving the finished reflecting grating as shown in FIG. 4G.

Figure 5A:
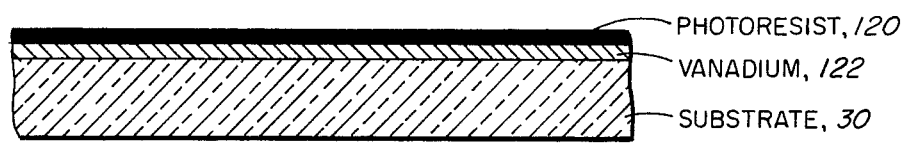
FIGS. 5A-5E show steps of another method for constructing a device as shown in FIG. 2.
Figure 5B:
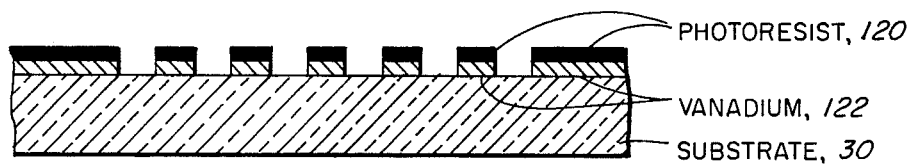
Figure 5C:
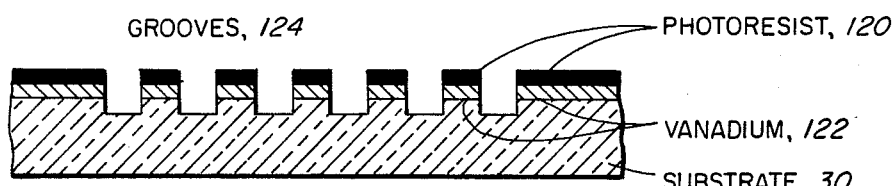
Figure 5D:
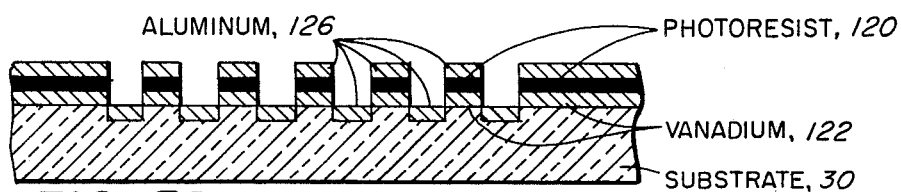
Figure 5E:
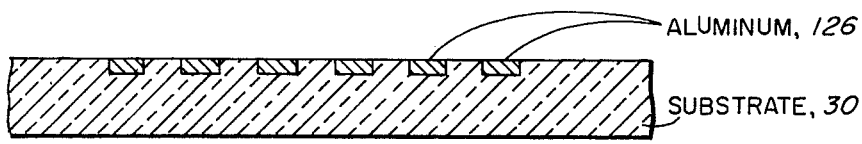

For acid-insoluble substrates, such as lithium niobate, another technique may be used. This is illustrated in the cross-section step-by-step method diagrams of FIG. 5A-5E. A substrate 30 is provided as before. The upper surface of substrate 30 is covered by a layer of vanadium 122 then by a layer of photoresist 120 as shown in FIG. 5A. Next, as shown in FIG. 5B, photoresist layer 120 is masked, exposed and chemically removed in the pattern shown in FIG. 5B. Portions of vanadium layer 122 are removed chemically through the open portions of photoresist layer 1201 As shown in FIG. 5C, grooves 124 ae ion-etched into substrate 30 through the open portions of photoresist layer 120 and vanadium layer 122. Aluminum layer 126 is then vapor deposited into grooves 124 and atop photoresist layer 120 until the upper surface of aluminum layer 126 is even with the upper surface of substrate 30 as illustrated in FIG. 5D. Finally, as shown in FIG. 5E, the remaining portions of photoresist layer 120 and vanadium layer 122 are chemically removed as is the portion of aluminum layer 126 lying atop photoresist layer 120.

Figure 6A:
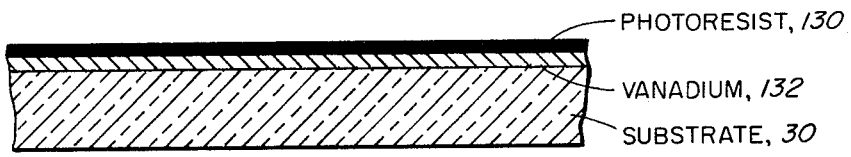
FIGS. 6A-6E are cross-sectional views showing steps of still another method for consructing a device as shown in FIG. 2.
Figure 6B:
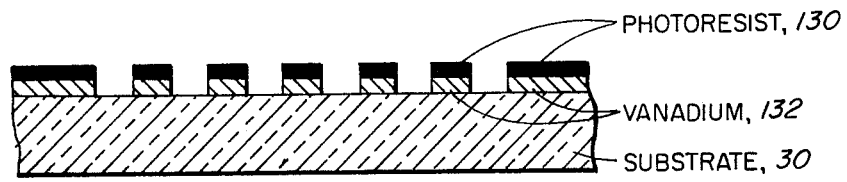
Figure 6C:
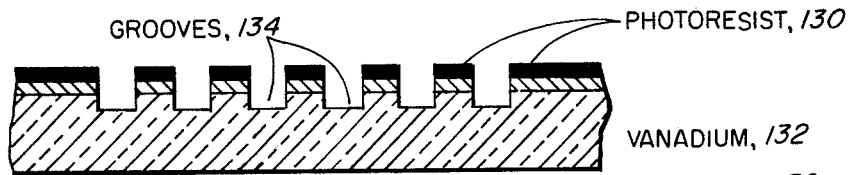
Figure 6D:
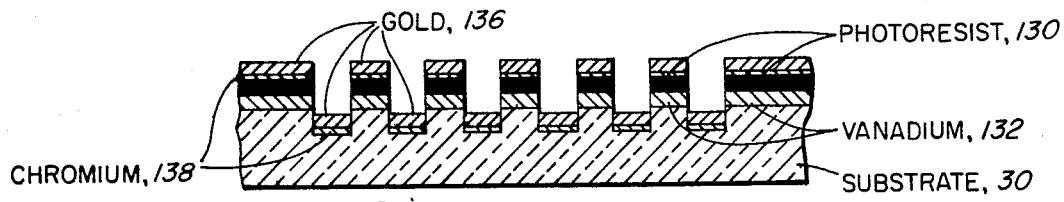
Figure 6E:
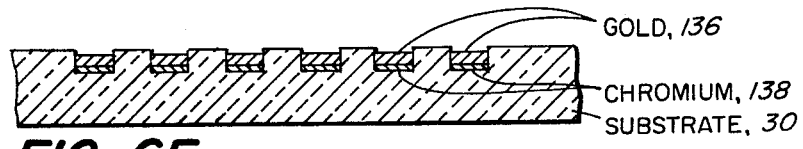

A procedure for producing a surface wave device with a reflecting grating having gold deposited within grooves in a quartz substrate is illustrated in the views of FIG. 6A–6E. A quartz substrate 30 is provided then covered with a layer of vanadium 132 and a layer photoresist 130 much as in the device shown in FIGS. 5A–5E. Next, also as shown in the previously described embodiment, openings are produced through photoresist layer 130 and vanadium layer 132 and grooves 134 are etched into substrate 30, as illustrated in FIG. 6C. A thin layer of chromium 138 is then deposited within grooves 134 and atop photoresist layer 130. The purpose of chromium layer 138 is to improve the adhesion of the gold stripes to the quartz as gold will not ordinarily adhere unaided to quartz. Gold layer 136 is then deposited atop chromium layer 138 to a preferred thickness which, as explained above, is less than the depth of the grooves 134 so that gold layer 136 is recessed within grooves 134. The completed reflecting grating is shown in the view of FIG. 6E.

This completes the description of the preferred embodiments of the invention. Although preferred embodiments of the invention have been described, it is believed that numerous modifications and alterations thereto would be apparent to one having ordinary skills in the art without departing from the spirit and scope of the invention.

What is claimed is:

1. In combination:
a substrate for supporting surface wave propagation; and one or more means for reflecting surface waves upon said substrate, said reflecting means having a plurality of substantially parallel grooves within said substrate and a plurality of metal stripes positioned on the surface of said substrate, one of said stripes being located between adjacent ones of said grooves, the width of said grooves and said metal stripes being substantially one-half the wavelength of said reflected surface waves.

2. The combination of claim 1 wherein:
at least some of said metal stripes are coupled in parallel.

3. The combination of claim 2 wherein the metal of said metal stripes comprises:
aluminum.

4. The combination of claim 3 wherein said substrate comprises:
lithium niobate.

5. The combination of claim 2 further comprising:
one or more transducers coupled to said substrate.

6. In combination:
a substrate for supporting surface wave propagation; and one or more means for reflecting surface waves upon said substrate, said reflecting means having a plurality of substantially parallel grooves within said substrate and metal stripes positioned within at least some of said grooves, the width of said grooves and said metal stripes and the distance between adjacent ones of said grooves being substantially one-half the wavelength of reflected surface waves.

7. The combination of claim 13 wherein said substrate comprises:
lithium niobate.

8. The combination of claim 7 wherein the metal of said metal stripes comprises:
aluminum.

9. The combination of claim 8 wherein:
the height of said metal stripes is less than the depth of said grooves.

10. The combination of claim 6 wherein:
said substrate comprises quartz.

11. The combination of claim 10 wherein the metal of said metal stripes comprises:
gold.

12. The combination of claim 11 further comprising:
a layer of chromium positioned between said gold and at least one surface of said grooves.

13. The combination of claim 6 further comprising:
one or more transducers coupled to said substrate.

14. A surface wave filter device comprising in combination:
a substrate for supporting surface wave propagation;
an input transducer coupled to said substrate for launching surface waves on said substrate in two opposed directions;
an output transducer for receiving at least a portion of the surface waves launched by said input transducer; and
at least four frequency selective surface wave reflecting means for directing at least portions of said surface waves launched by said input transducer, each of said reflecting means comprising a plurality of substantially parallel grooves within said substrate and a plurality of metal stripes positioned between said grooves, one of said stripes being located between adjacent ones of said grooves, the width of said grooves and said stripes being substantially one-half the wavelength of the reflected surface waves.

15. The combination of claim 14 wherein:
said substrate comprises lithium niobate; and
said metal of said metal stripes comprises aluminum.

16. The combination of claim 15 wherein:
said metal stripes are coupled in parallel.

17. The combination of claim 15 wherein:
said reflecting means are four in number; and
said reflecting means are positioned to form a substantially rectangular propagation path for surface waves propagating between said input and output transducers.

18. The method comprising the steps of:
providing a substrate of lithium niobate material having at least one surface adapted for propagation of surface waves thereupon;
covering at least a portion of said surface with a layer of aluminum metal;
removing portions of said layer of metal in the form of a plurality of parallel stripes; and removing portions of said substrate lying beneath the removed portions of said layer of metal to a predetermined depth.

19. The method of claim 18 wherein said step of removing portions of said layer comprises the step of:

removing predetermined parts of the remaining portions of said metal layer so as to leave the finally remaining portions of said metal layer in the form of parallel interconnected stripes.

20. The method of claim 18 wherein said step of removing portions of said substrate comprises:

ion etching.

21. The method comprising the steps of:

providing a substrate of material having at least one surface adapted for propagation of surface waves thereupon;

covering at least portions of said surface with a first layer of metal;

removing portions of said first layer of metal in the form of a plurality of parallel stripes;

removing portions of said substrate lying beneath the removed portions of said first layer of metal to a predetermined depth to form a plurality of grooves in said substrate;

depositing a second layer of aluminum within said grooves; and removing the remaining portions of said first layer of metal.

22. The method of claim 21 wherein:

said substrate comprises lithium niobate.

* * * * *

UNITED STATES PATENT OFFICE
CERTIFICATE OF CORRECTION

Patent No. 4,130,813          Dated    Dec. 19, 1978

Inventor(s) Frank Sandy, Clarence J. Dunnrowicz

It is certified that error appears in the above-identified patent and that said Letters Patent are hereby corrected as shown below:

Column 7, line 8: Change "ae" to - are - ;

Column 8, line 11: change "13" to - 6 - .

Signed and Sealed this

Sixth Day of March 1979

[SEAL]

Attest:

RUTH C. MASON
*Attesting Officer*

DONALD W. BANNER
*Commissioner of Patents and Trademarks*